United States Patent [19]

Johannsen et al.

[11] 4,119,964

[45] Oct. 10, 1978

[54] SYSTEMS AND METHODS FOR DETERMINING RADIO FREQUENCY INTERFERENCE

[76] Inventors: James C. Fletcher, Administrator of the National Aeronautics and Space Administration, with respect to an invention of Klaus G. Johannsen, Pacific Palisades; Samuel Sabaroff, Woodland Hills, both of Calif.; Varice F. Henry, Hyattsville, Md.

[21] Appl. No.: 736,286

[22] Filed: Oct. 28, 1976

[51] Int. Cl.² .............................................. G01S 7/40
[52] U.S. Cl. ...................................... 343/17.7; 325/4; 325/67
[58] Field of Search .................... 343/17.7, 100 ST; 324/57 N; 325/4, 67

[56] References Cited

PUBLICATIONS

E. E. Steinbrecher et al., A Computer-Controlled Satellite Signal Monitoring System, Comsat Technical Review, vol. 1, No. 1, pp. 79–116, Fall 1971.

Primary Examiner—T.H. Tubbesing

Attorney, Agent, or Firm—Ronald F. Sandler; John R. Manning; John O. Tresansky

[57] ABSTRACT

The presence, frequency and amplitude of radio frequency interference superimposed on communication links originating from a terrestrial region and including a relay in a geostationary spacecraft are determined by pointing a narrow beam antenna on the satellite at the terrestrial region. The level of noise radiated from the region, in a predetermined frequency band of interest, to the antenna is measured at a terrestrial station that is usually remote from the region. Many of the measurements are performed in each of a plurality of frequency bands across the spectrum. Calibrating radio signals having a plurality of predetermined EIRP's (Effective Isotropic Radiated Power) and frequencies in the spectrum are transmitted from the region through the spacecraft narrow beam antenna back to the station. At the station, the levels of the received calibrating signals are separately measured for each of the frequency bands and EIRP's. In response to comparisons of the measured amplitudes of like frequencies of the calibrating signals and noise, the presence, frequency and amplitude of sources of radio frequency interference originating from the region are determined.

17 Claims, 11 Drawing Figures

SYSTEMS AND METHODS FOR DETERMINING RADIO FREQUENCY INTERFERENCE

ORIGIN OF THE INVENTION

The invention described herein was made in the performance of work under a NASA contract and by an employee of the United States Government and is subject to the provisions of Section 305 of the National Aeronautics and Space Act of 1958, Public Law 85–568 (72 Stat. 435; 42 U.S.C. 2457), and may be manufactured and used by or for the Government for governmental purposes without the payment of any royalties thereon or therefor.

FIELD OF THE INVENTION

The present invention relates generally to systems and methods for determining radio frequency interference, and more particularly to a system and method for determining the presence of radio frequency interference in a communication link, including a geostationary, synchronous spacecraft.

BACKGROUND OF THE INVENTION

There is presently a need for obtaining experimental data on radio frequency interference (RFI) superimposed by terrestrial communication systems on satellite communications systems. The need arises because of plans for domestic satellite communication systems at approximately 6 gigahertz (gHz), a band presently allocated to existing terrestrial radio systems that are extensively employed for relaying television, telephone and other communications between widely spaced regions of the United States.

Theoretically, terrestrial based relay systems in the 6 gHz frequency band transmit only on line of sight paths between cooperating, spaced antennas, usually mounted on towers. Theoretically, the side lobe power of these antennas is insufficient to interfere with communication links including satellites in geostationary orbits, approximately 22,000 miles above the earth. In actuality, however, it is believed that in these terrestrial systems there is significant side lobe power that interferes with signals transmitted through the spacecraft in the proposed 6 gHz frequency band.

It is, accordingly, an object of the present invention to provide a system for and a method of determining the presence of noise superimposed on a communication link including a geostationary synchronous satellite. In the present disclosure and claims, the term noise refers to an interfering source that is coupled through a geostationary, synchronous satellite to a terrestrial station, but which is not intended to be coupled through the satellite.

By measuring the noise interfering with a communication link including a geostationary satellite, is it possible to establish realistic satellite protection ratios and to investigate the feasibility of establishing mathematical models for predicting radio frequency interference (RFI) with communication links including the satellite and/or other geostationary satellites. In addition, by determining the geographic and frequency distribution of terrestrial RFI noise sources, it is possible to locate optimum terrestrial positions and frequency band for geostationary satellites utilized for communication purposes.

To determine the interference superimposed on any particular communication link coupled through a geostationary satellite, it is necessary to determine the power density per unit signal band width over the spectrum of interest, i.e., watts per frequency interval (e.g., 0.1 mw/10kHz). For any given communication system, the noise power per channel, due to external sources, at a receiver output is directly related to the noise power at the receiver input. It can be shown that as the number of channels in a typical satellite communication system increases, there is a resulting increase in noise. Hence, it is desirable to monitor noise in each relatively narrow frequency band (typically 10 kHz) across an entire spectrum of a communication link.

The present invention, by monitoring the interfering or noise power superimposed on a communication system including a geostationary satellite relay system, is capable of determining the minimum Effective Isotropic Radiated Power (EIRP = power supplied to an antenna of the communication link time antenna gain) of a terrestrial transmitter of the communication link.

While the present invention is described particularly in connection with communication links between the earth and a geostationary satellite of the earth and in connection with particular frequency bands of interest, it is to be understood that the invention is equally applicable to determining the interference between any celestial body and any communication satellite of that body and for any spectrum of interest.

BRIEF DESCRIPTION OF THE INVENTION

In accordance with the present invention, there is provided a method of and apparatus for determining the presence or radio frequency interference in communication links including a terminal on a celestial body and a relay on an artificial geostationary satellite of the body. The level of noise originating from a region including the terminal and superimposed on the link is measured by pointing a narrow beam antenna on the spacecraft at the region while only noise originates from the region, and detecting the level of the radio frequency energy transduced by the antenna in each of a plurality of frequency bands at a measuring station. The communication link is calibrated by transmitting calibrating radio signals of predetermined EIRP's and frequency from the region via the antenna through the satellite to the station while the antenna is pointed toward the region. The level of electromagnetic energy received by the station while only noise sources are radiated from the region and while the calibrating signals are radiated from the region are separately detected and compared to determine the presence of radio frequency interference in the spectrum of the communication link. The entire link, from the region through the spacescaft relay and to the station, including a detector at the station is linear, so that by measuring and comparing the levels of the radio frequency noise and calibration signals received at the station in each of the frequency bands, and frequency, location and amplitude of noise sources in the region are determined.

The amplitude of the noise sources is determined by transmitting from the region electromagnetic waves having predetermined EIRP's that are relatively widely spaced and interpolating between the detected amplitudes of the calibrating signals to the noise for corresponding frequencies of the calibrating signals and noise. If the frequencies of the noise and calibrating signals differ as is likely because the number of calibrating frequencies is less than the number of frequency bands in which noise measurements are made, interpolations are made between the detected levels of the different calibration frequencies for the same transmitted power level of the calibrating signal. A calibrated system is employed to determine the amplitude of the received noise energy because there are substantial variations in transmitting and receiving antennas, as well as transmitter and receiver responses across the relatively wide frequency band (500 mHz in one example) being considered and because of the large area of the region (in one embodiment having a length of approximately 200 miles) at which the antenna is pointed at a particular time, and the numerous sources of possible interfering signals that may be derived from that region.

To maximize the accuracy of the system, many noise measurements are made at a particular frequency. The noise measurements at a particular frequency are averaged together to determine the interfering power at a particular frequency band, and this averaged level is compared with the calibrated signal level for the particular frequency band. The standard deviation ($\sigma$) for each frequency band noise measurement is also determined, and if it is excessively large, such as $2\sigma$, the noise information for the particular frequency band is ignored.

Prior to any noise measurements from the area of interest being performed, the narrow beam spacecraft antenna is pointed toward an area on the body where it is known that there is a minimum amount of interference in the spectrum of the communication links that are relayed through the satellite (this area is hereafter referred to as a minimum noise area). For a geostationary satellite of the earth, the ocean is a minimum noise area. The level of electromagnetic energy received by the antenna while it is pointed toward a minimum noise area is measured. From this measurement, a determination is made as to whether the radio frequency energy level received by the antenna from the minimum noise area exceeds the level of any of the received calibration signals. If the two levels are approximately the same for any frequency band, an indication is provided that the calibration measurement actually did not provide any information to the system in that frequency band. In addition, if there is a significant variation in the detected electromagnetic energy level while the narrow beam antenna is pointed toward the minimum noise area, an indication is provided to a system operator that there has been a significant change in the threshold of the communication system.

After the narrow beam antenna has been pointed toward a particular region and the spectrum of interest has been scanned, the antenna is pointed to a different region and the measurements are repeated. To enable calibrations to be made from each of the region,s portable calibration terminals can be provided and ordered to transmit a calibrating sequence each time a measurement is made from a particuar region. Thereby, there is constant recalibration of the system at each monitored region, to obviate the possibility of errors in the propagation paths from different regions to the geostationary satellite.

The several measurements are preferably made at a fixed station on the celestial body by relaying signals through the satellite to a station on the celestial body. If the celestial body is earth, a convenient location for the station is Rosman, North Carolina. At the receiving station, the data are collected and supplied to an appropriate computer for data processing operation,s such as storing signals, calculating average and standard deviation values, and comparing the different stored signals.

In many instances, it is desired to obtain a gross measure of the frequency and spatial frequency distribution of sources that interfere with the communication links including the geostationary satellite. In such instances, the spatial and frequency scans are accelerated by widening the frequency window of the receiver, which in turn allows a faster spatial scan. In a typical example, wherein a 500 mHz band is usually swept through 10 kHz steps, the steps are increased to 100 kHz.

It is accordingly, an additional object of the invention to provide a system for and method of determining radio frequency interference superimposed over an extended frequency band on communication links including geostationary satellites.

Another object of the invention is to provide a system for and method of determining the frequency and amplitude distribution of radio frequency interference superimposed on communication links including geostationary satellites as relay stations.

The above and still further objects, features and advantages of the present invention will become apparent upon consideration of the following detailed description of one specific embodiment thereof, especially when taken in conjunction with the accompanying drawing.

DETAILED DESCRIPTION OF THE DRAWING

Figure 1:
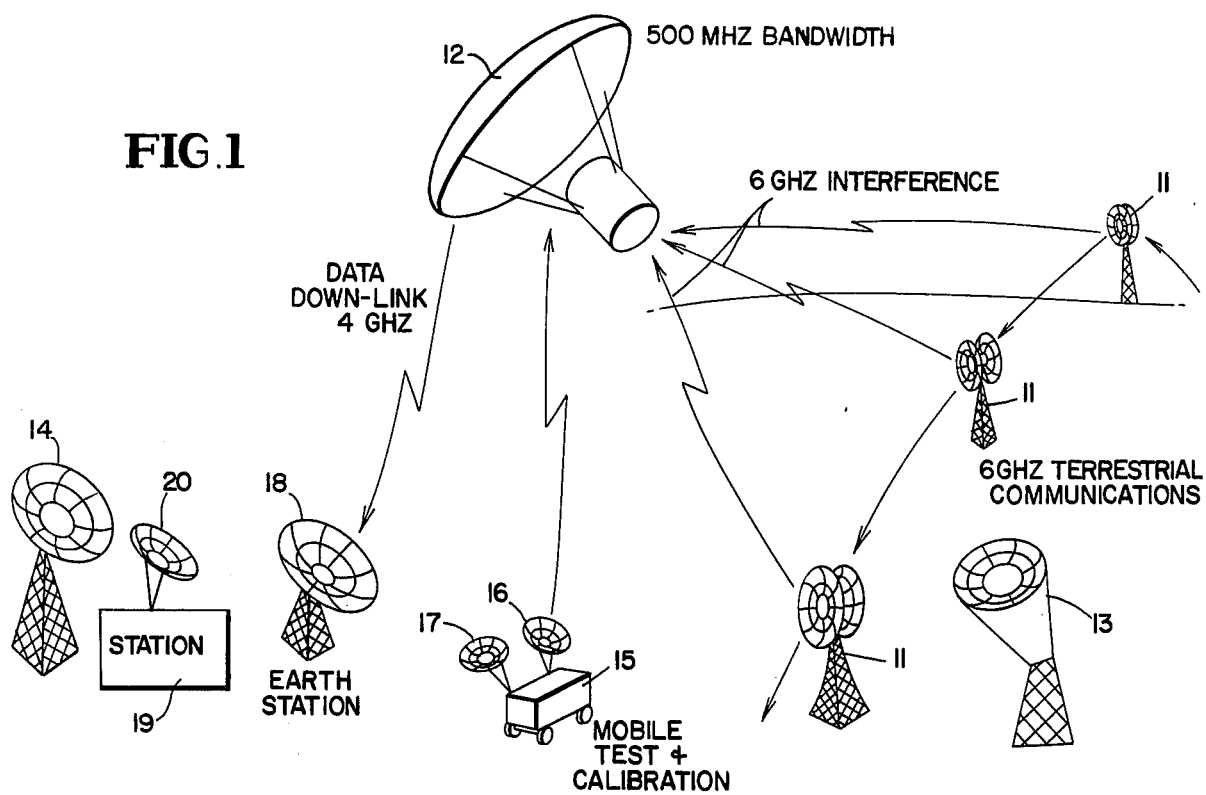
FIG. 1 is a pictorial representation of the system and method of the present invention.

Reference is now made to FIG. 1 of the drawing wherein there is illustrated a plurality of microwave relay towers 11 that provide a terrestrial 6 gHz communications link utilized for telephony, television, and other types of communications. Towers 11 are in line of sight with each other and are typically spaced approximately 35 miles apart. Theoretically, antennas included on towers 11 have relatively low side lobe power and do not provide any interference with other communication systems. However, it is the purpose of the present invention to determine if this theoretical assumption is true and if the terrestrial communication system established by towers 11, as well as other terrestrial communication systems in the 6 gHz region, provide interference with 6 gHz satellite communication links including terrestrial antenna 13, located in the same region as towers 11, and an antenna included on geostationary spacecraft 12, which is positioned 22,000 miles above the earth in a stationary equatorial orbit. The communication link between antenna 13 and spacecraft 12 extends to antenna 14 that typically has a terrestrial location spaced from the region where antenna 13 and towers 11 are located. Typically, the link between antenna 14 and spacecraft 12 is at a frequency displaced from the link between spacecraft 12 and antenna 13. The communication links between antennas 13 and 14 through spacecraft 12 is via an earth coverage horn included in the spacecraft and high gain main lobes of antennas 13 and 14.

To determine the interference superimposed by microwave towers 11, as well as other 6 gHz sources, on the satellite communication link subsisting between spacecraft 12 and antennas 13 and 14, a mobile test and calibration unit 15, including six foot transmit and receive dishes 16 and 17, is brought into the same region as towers 11 and antenna 13. Calibration signals with a predetermined effective isotropic radiated power (EIRP), in the 6 gHz frequency spectrum of the interference from towers 11, are transmitted from antenna 16 through a steerable, narrow beam spacecraft antenna, typically having a gain of 50 dB. The signals transmitted from antenna 16 to spacecraft 12 are shifted in frequency on the spacecraft and transmitted back to a high gain, terrestrial antenna 18 that is typically remotely located from the region of towers 11 or antennas 13 and 14. Communications between spacecraft 12 and antenna 18 is via an earth coverage horn included on the spacecraft. The amplitude of different frequencies transmitted from unit 15 to antenna 18 via spacecraft 12 are determined and stored in a computer included in base station 19 that is connected to the output of antenna 18 and is located close to the antenna. Antenna 18, station 19 and antenna 20 (later referenced) may be referred to as the Earth station.

To determine the noise from towers 11, as well as other sources in the region of the towers and antenna 13, that interferes with the communication link between antenna 13 and spacecraft 12, transmitting antenna 16 and antenna 13 are deactivated. With antennas 13 and 16 deactivated, the amplitude of radio frequency power transmitted from the region where towers 11 are located to spacecraft 12 is monitored in each of a plurality of discrete frequency bands in the 6 gHz region. This result is performed by stepping the band passes of receiver circuitry responsive to antenna 18 by the computer over a number of intervals and detecting the amplitude of the RF energy in each of these intervals. These responses are stored in the computer at station 19 and are compared with the stored calibration signals which resulted from transmission from antenna 16.

To establish the level of RFI noise in the system including spacecraft 12, antenna 18 and station 19, the narrow beam, steerable antenna on spacecraft 12 is pointed at a terrestrial region known to have a minimum amount of RFI noise, such as the ocean. The RFI noise level from this low RFI noise source is monitored at station 19 for the same frequencies as are transmitted from mobile unit 15 to antenna 18 via spacecraft 12. The RFI noise levels derived from the low RFI noise region are detected at and stored in the computer at station 19, after having been transduced by the high gain antenna of spacecraft 12 and transmitted to antenna 18 by the earth coverage horn. In the computer, the RFI noise level is compared with measurements made during calibration. If the RFI noise and calibration energy levels are approximately the same, an indication is provided that the calibration measurement actually did not provide any information to the system. In addition, if there is a significant variation in the detected electromagnetic energy level from the low noise region from the time when one set of RFI noise measurements is made to the time when another set of noise measurements is made (typically a set of measurements is made monthly), an indication is provided that there has been a significant change in the threshold of the communication system including spacecraft 12.

In order to establish synchronization for the different frequency calibration signals transmitted from unit 15 to station 19, a synchronization signal is relayed from unit 15 through spacecraft 12 to station 19 prior to transmission of the calibration signals. The synchronization signals enable calibration signals to be transmitted at precise time intervals from transmitting antenna 16 of unit 15 to establish the transmission delay time from unit 15 to station 19 via spacecraft 12. Determining the transmission delay time between antenna 18 and unit 15 is important to enable the band pass of the receiver responsive to antenna 18 to be stepped in synchronism with receipt of calibrating signals from unit 15.

Typically, the frequencies between unit 15, spacecraft 12 and antenna 18 are allocated as follows:

uplink from antenna 16 to the high gain antenna of spacecraft 12, 5.925–6.425 gHz;

transmission of calibrating signals and noise from earth coverage horn of spacecraft 12 to high gain antenna 18, 3.7–4.2 gHz;

transmission of synchronizing data from antenna 18 to earth coverage horn of spacecraft 12, 5.925–6.425 gHz;

transmission of synchronizing data from earth coverage horn of spacecraft 12 to receiving antenna 17 of unit 15, 3.7–4.2 gHz.

In addition, there is a fixed calibration terminal including antenna 20, at the same location as station 19. The fixed calibration terminal includes a six foot antenna that transmits a 5.925–6.425 gHz signal to the narrow beam, pointable antenna of spacecraft 12, and which can be relayed back to antenna 18 via the 3.7–4.2 gHz earth coverage horn of the spacecraft.

Figure 2A:
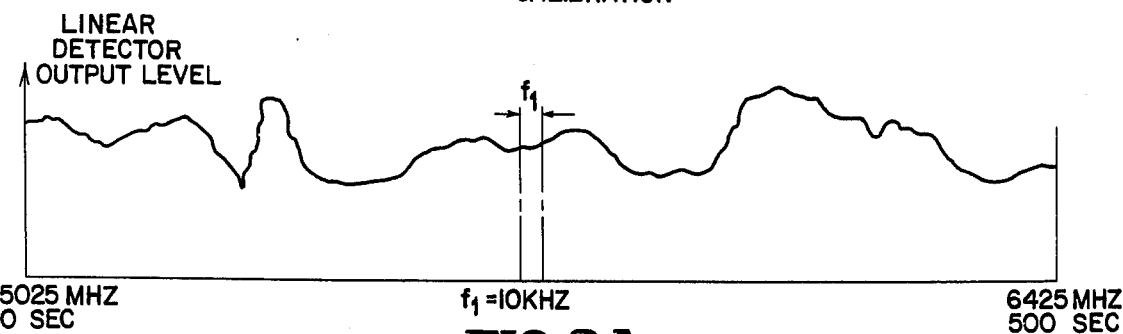
FIGS. 2a and 2b are wave forms illustrating the nature of certain wave forms derived in the system of the present invention.
Figure 2B:
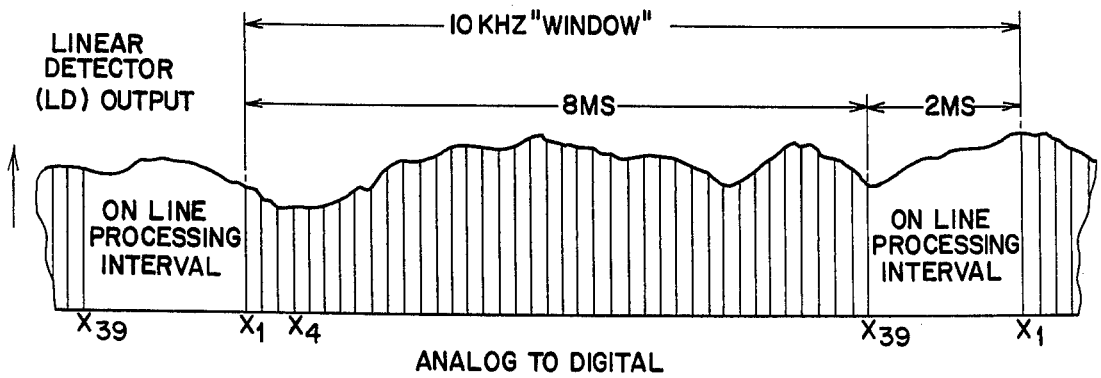

The noise from the region including towers 11 and antenna 13 is processed at station 19 in a manner indicated by FIGS. 2a and 2b. In particular, the amplitude of the noise is successively monitored in 50,000 different frequency bands, each having a 10 kHz band width, for a total of 500 seconds over a frequency band from 5.925 to 6.425 gHz. During each 10 kHz interval, 39 different samples are taken over an 8 millisecond time period, so that each sample subsists for approximately 500 microseconds. The amplitude of each of the 500 microsecond samples is separately detected and converted to a digital signal that is supplied to the computer. At station 19, the samples are detected with a linear detector having a dynamic 40 db range. The 39 samples taken over each 10 kHz interval are stored and processed by the computer to determine the mean value and variance of the 39 samples; the mean value and variance are stored for later processing, unless the variance is excessive, in which case a notation is made that no meansingful data are derived for the particular 10 kHz interval. Upon completion of the 39th sample of each 10 kHz interval, a 2 millisecond on-line processing interval is provided to assure that the 39 samples have been stored in the computer and to enable the band pass of the detector responsive to the output of antenna 18 to be shifted 10 kHz.

The noise data stored in the computer are compared with the calibration data. Calibration data are derived by transmitting calibration signals having precise different amplitudes and different frequencies from antenna 16 of unit 15 through spacecraft 12 to antenna 18 and measuring the amplitude of the received signal at antenna 18 for each of the frequencies and amplitudes transmitted from unit 15. In the alterantive, if the region being monitored for noise interference is close to station 19, station 19 feeds calibration signals to antenna 20; the calibration signals from antenna 20 are relayed through spacecraft 12 to antenna 18.

Four amplitude levels are derived for the calibration signals. Initially, a transmitter of unit 15 is adjusted to transmit power at the first predetermined level, 0 dbw. At 0 dbw, 5000 calibration bursts, each having a 10 kHz band width, are transmitted from antenna 16 at 100 kHz frequency intervals over the 5.925 gHz–6.425 gHz spectrum. In synchronism with the transmission of the bursts from antenna 16, tuning circuitry in the receiver of station 19 is stepped so that when a particular frequency transmitted from antenna 16 is received at antenna 18, the receiver at station 19 is utned to the corresponding frequency. As the frequency transmitted from antenna 16 is stepped in 100 kHz increments, the frequency of the receiver at antenna 18 is correspondingly stepped, with compensation being provided for the delay in the propagation time from antenna 16 to antenna 18. The level of the received signal at each of the 100 kHz intervals received at station 19 is detected and stored in the computer at that station. After the 5000 calibration bursts at 0 dbw, covering the range from 5.925 gHz to 6.425 gHz, have been transmitted from antenna 16 and received at station 19, the power level of the signal transmitted from unit 15 is increased by 10 db to +10 dbw and the process is repeated for the same 5000 10 kHz calibrating bursts, from 5.925 gHz to 6.425 gHz. After the +10 dbw calibration transmission has occurred, the power level derived from unit 15 is increased by an additional 10 db, to +20 dbw and the process is repeated; thereafter the power level derived from unit 15 is increased by an additional 10 db to 30 dbw, and the sequence is repeated. For each of these power levels, the tuned frequency of the receiver at station 19 is stepped in synchronism with receipt of the different calibration bursts.

At station 19, the received level of calibration signal at antenna 18 is linearly detected and stored in the computer. By extrapolating between the 100 kHz intervals, four calibration traces are thereby assembled and stored in the computer. The levels of the calibration traces are compared with the levels transmitted from the region including towers 11 through spacecraft 12 to antenna 18 when data are collected in the manner indicated in FIGS. 2a and 2b. The calibration levels are compared with the levels of the received "data" (which is actually the interfering noise from the region including towers 11) to determine the presence, amplitude and frequency of the interfering sources.

Figure 3:
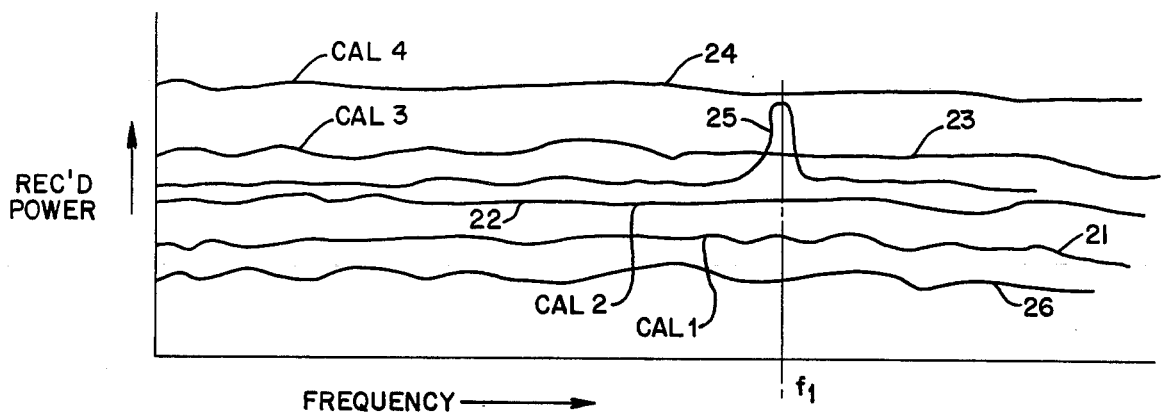
FIG. 3 is an illustration of amplitude versus frequency responses of calibrating, data and noise traces which assist in describing the operation of the present invention.

In FIG. 3 are illustrated the amplitude versus frequency responses of the power received at antenna 18 for an exemplary "data" trace, exemplary calibration traces, and for system noise. Calibration tracess 21, 22, 23 and 24 are respectively derived in response to unit 15 driving antenna 16 at the 0 dbw, +10 dbw, +20 dbw, and +30 dbw levels, while the narrow beam antenna of spacecraft 12 is pointing toward the region where towers 11 and unit 15 are located, and while there is no 6 gHz transmission from antenna 13 toward spacecraft 12. Data trace 25 is derived by pointing the narrow beam antenna of spacecraft 12 at the same region while no signal in the 6 gHz region is transmitted fom unit 15 on antenna 16 toward spacecraft 12. Noise trace 26 is derived by pointing the narrow beam antenna of spacecraft 12 toward the ocean and by stepping the tuned frequency of the receiver at station 19 in the same manner as the receiver tuned frequency is stepped during calibration. The computer subtracts noise trace 26 from the remaining traces to derive an indication of the power level of the received data and received calibration signals. The noise measurement is performed relatively infrequently, such as once a month, to provide confidence in the calibration and measurements. If, for a particular frequency band, the level for the lowest power calibration signal received at antenna 18 is approximately the same as the noise level, the lowest level calibration signal received by antenna 18 can be considered as containing no information and cannot be used to determine the amplutide of data trace 25.

To determine the level of data (interfering noise from towers 11) in trace 25, such as a peak that exists at frequency $F_1$, the peak value at frequency $F_1$ is interpolated between the levels of the received calibration signals for calibration traces 23 and 24. For example, if the peak of trace 25, at frequency $F_1$, is three-quarters of the way between calibration traces 23 and 24, the interfering power at frequency $F_1$ is interpolated to be 27.5 dbw. A calibrated system is used to determine the amplitude of data in trace 25 because of the possible substantial variations that can exist in the responses of antennas, transmitters and receivers in the link from the region including towers 11 through spacecraft 12 to antenna 18 and the receiver connected to the antenna over the wide 0.5 gHz frequency spectrum and because of the large number of sources that can exist in the relatively large area monitored by the stationary narrow beam antenna of spacecraft 12 at any one time. In particular, a typical region at which the antenna of spacecraft 12 is pointed has a generally elliptical or oval shape with a major axis on the order of 200 miles and a minor axis of approximately 50 miles.

It is possible to determine the level of data in trace 25 utilizing an interpolation technique because the entire system from the region including towers 11 to station 19, including the receiver responsive to antenna 18 and a transponder included on spacecraft 12, is linear over a 40 db amplitude range.

After the date for a particular area have been collected, the narrow beam antenna on spacecraft 12 is moved so that it is spot pointed at a new region that may or may not be contiguous with the region including towers 11. At the new region, a mobile testingcalibration unit 15 is located and a new set of calibration traces is derived, in the manner described previously. The new calibration traces are stored in the computer at station 19. A new set of "data" is also taken with the antenna pointing at the new region, in the manner described supra; these new data are also stored in the computer. The calibration and data signals from the new region ae combined with the noise trace previously derived to determine the presence, amplitude and frequency of interfering sources in the new region. In the manner described, many terrestrial regions are monitored and determinations of the presence, amplitude and frequency of interference by terrestrial sources of communication links in the 6 gHz region are determined for each geographic region. The data are utilized to determine if the terrestrial communications links should be modified or if communication links through the spacecraft require additional power at particular regions.

Prior to a particular region being investigated by spot pointing the narrow beam antenna of spacecraft 12 toward it, a gross determination is made that interfering sources are likely to exist in the region. The gross determination is made by continuously raster scanning a relatively large terrestrial area of interest, such as the contiguous 48 states of the U.S., at one time by continuously moving the beam of the high gain narrow beam antenna of spacecraft 12 over the area of interest in response to conventional control signals transmitted from station 19 to the spacecraft. As the beam of the high gain antenna is scanned over the area of interest, the energy in one of the 10 kHz frequency bands in the 5.925–6.425 gHz region is frequency translated by the spacecraft transponder and is retransmitted back to antenna 18 via the 3.7 gHz–4.2 gHz link. The receiver at station 19 is tuned to the 10 kHz frequency region of interest and the amplitudes of the signals resulting from the scanning action are recorded and stored in the computer to enable the gross geographic location of RFI sources in the scanned region to be determined.

In response to a peak signal amplitude being detected as a result of the raster scan, the beam of the high gain antenna of spacecraft 12 is sequentially scanned in two orthogonal directions in response to conventional control signals transmitted to the spacecraft from station 19. Typically, the narrow beam antenna is initially scanned from east to west or west to east and then is scanned a second time from north to south or south to north. The intersection of the two orthogonal scan lines falls within the geographic region which the raster scan indicated as being the desired region to investigate for radio frequency interference in the frequency band of interest. In the simplest case, where there is only one source of radio frequency interference in the orthogonally scanned region, the output of a detector at station 19 is represented, as a function of time, by traces 31 and 32 illustrated in FIG. 4. Trace 31 represents the output of the detector as the pointing angle of the narrow beam antenna is being scanned in the east-west direction, while trace 32 represents the output of the detector as the narrow beam antenna is subsequently scanned in the north-south direction. The time displacement of the detector output is correlated with the position of the bore sight axis of the narrow beam antenna of spacecraft 12 to enable traces 31 and 32 to be reconstructed as spatial positions. The maximum amplitudes of traces 31 and 32 are projected along lines parallel to the directions of scan of the narrow beam antenna, along lines 33 and 34. Intersection 35 of lines 33 and 34 indicates the spatial position of the radio frequency interfering source of interest. The same region can be scanned multiple times with the receiver responsive to antenna 18 tuned to different 10 kHz frequency bands over the 0.5 gHz band of interest.

Traces 31 and 32 can be derived by feeding the output of the detector to an X-Y recorder. While trace 31 is being made, the X axis of the recorder is responsive to a linear saw tooth waveform, representing the east-west position of the orthogonally scanned antenna beam and the Y axis is responsive to the detector output. While trace 32 is being made, the Y axis of the recorder is responsive to the linear saw-tooth waveform, to represent the north-south position of the antenna beam and the X axis is responsive to the detector output. Alternatively, the detector output is stored in the computer and correlated with the position of the antenna beam and the computer drives an X-Y recorder to form traces 31 and 32.

Figure 5:
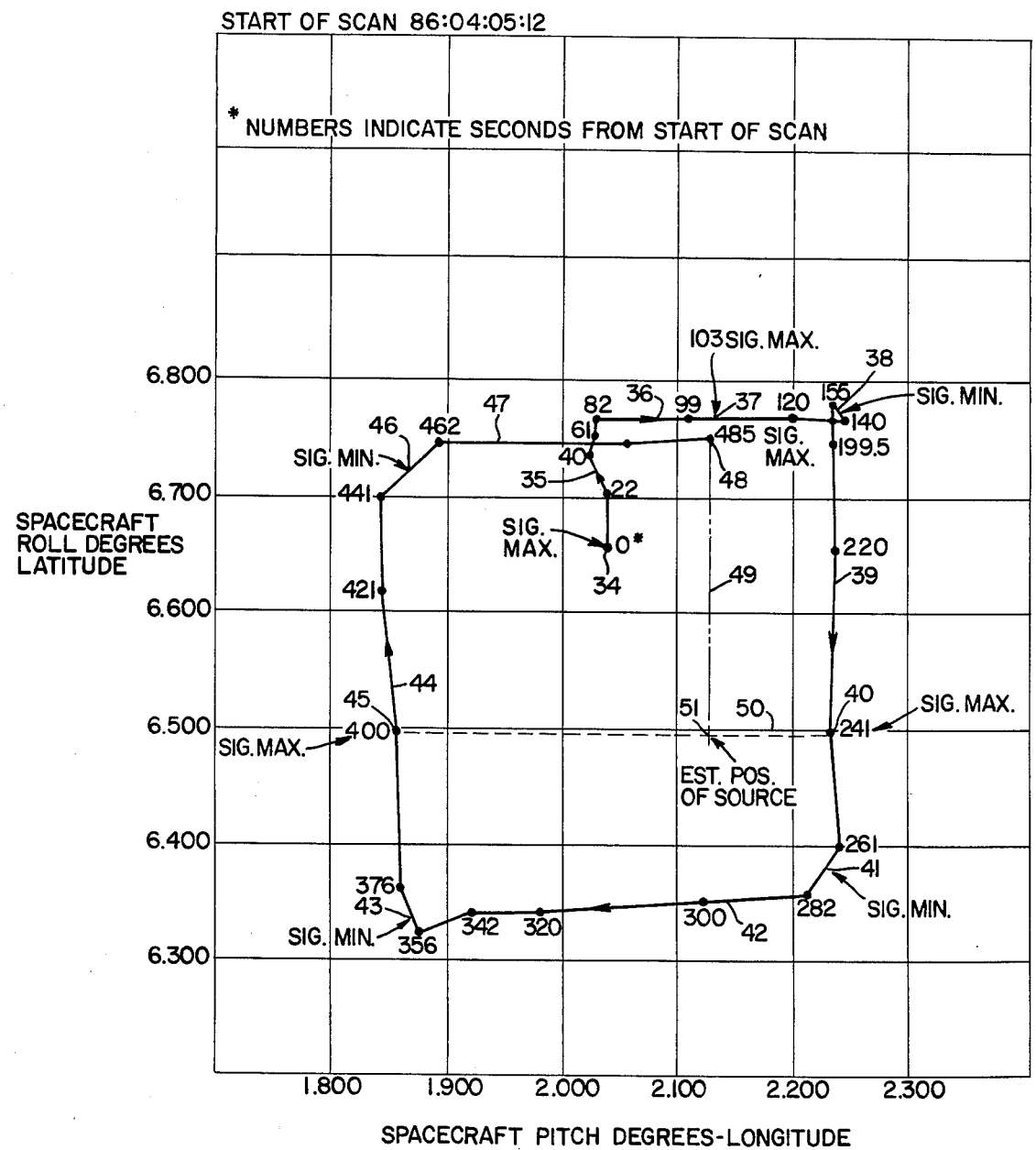

For accurate determination of the position of interfering source, the spacecraft narrow beam pointing angle is scanned along the Z-axis roll and pitch angles of spacecraft 12 as a function of time in rectangular coordinates. As the antenna beam axis is being translated, the pointing angle of the antenna is recorded by the computer, simultaneously with reception of and recording of the amplitude of the signal transduced by the narrow beam antenna, as coupled to antenna 18 by spacecraft 12. One actual plot of such a scan is illustrated in FIG. 5, wherein longitude or pitch angle in degrees is plotted along the X-direction and latitude or roll angle in degrees is plotted along the Y-direction. The maximum and minimum output signals of the detector responsive to antenna 18 are indicated.

Scanning is initiated at point 34, where the raster scan signal maximum is detected. From point 34, the antenna bore sight axis is scanned in roll angle relative to spacecraft 12, while the antenna bore sight axis position remains constant in the pitch angle direction; the scanning is along line 35. Scanning in a direction at right angles to line 35, i.e., by varying pitch angle and maintaining roll angle constant, is performed along line 36. A signal maximum is detected along line 36 at point 37. Scanning continues along line 36 until a signal minimum at point 38 is detected by the receiver at station 19, at which time a command signal from station 19 causes the spacecraft antenna to be scanned along line 39 in a direction orthogonal to line 36. As the antenna is scanned along line 39, a signal maximum is detected at point 40. Scanning continues along line 39 until a signal minimum is detected at point 41, at which time the scanning direction is changed to be at right angles to line 39, whereby scanning proceeds along line 42 until a signal minimum is detected at point 43. In response to detection of the signal minimum at point 43, scanning proceeds parallel to line 39, but in an opposite direction, along line 44. As scanning continues along line 44, a signal maximum is detected at point 45. Scanning along line 44 continues until a signal minimum is detected at point 46, at which time the scanning direction is again changed so that it is parallel to, but in an opposite direction from the scanning along line 42. Scanning along line 47 continues until a signal maximum is again detected at point 48. It is noted that points 47 and 48 are aligned and that points 40 and 45 are aligned.

To determine the position of the source, orthogonal lines 49 and 50 are respectively drawn between points 37 and 38, and between points 40 and 45. Intersection 51 of lines 49 and 50 provides a relatively accurate estimate of the position of the RFI source. It is noted that approximately the same results would have been obtained by projecting lines 49 and 50 parallel to scan lines 36 and 39 to define intersection 51. Hence, scanning along lines 42, 44 and 47 is not actually necessary, but was performed in the exemplary, illustrated scan to check the accuracy of the scanning technique.

Having described the general, overall system operation, consideration is now given to the specific equipment included at station 19, at portable calibrating unit 15, and in the transponder included in spacecraft 12.

Figure 6:
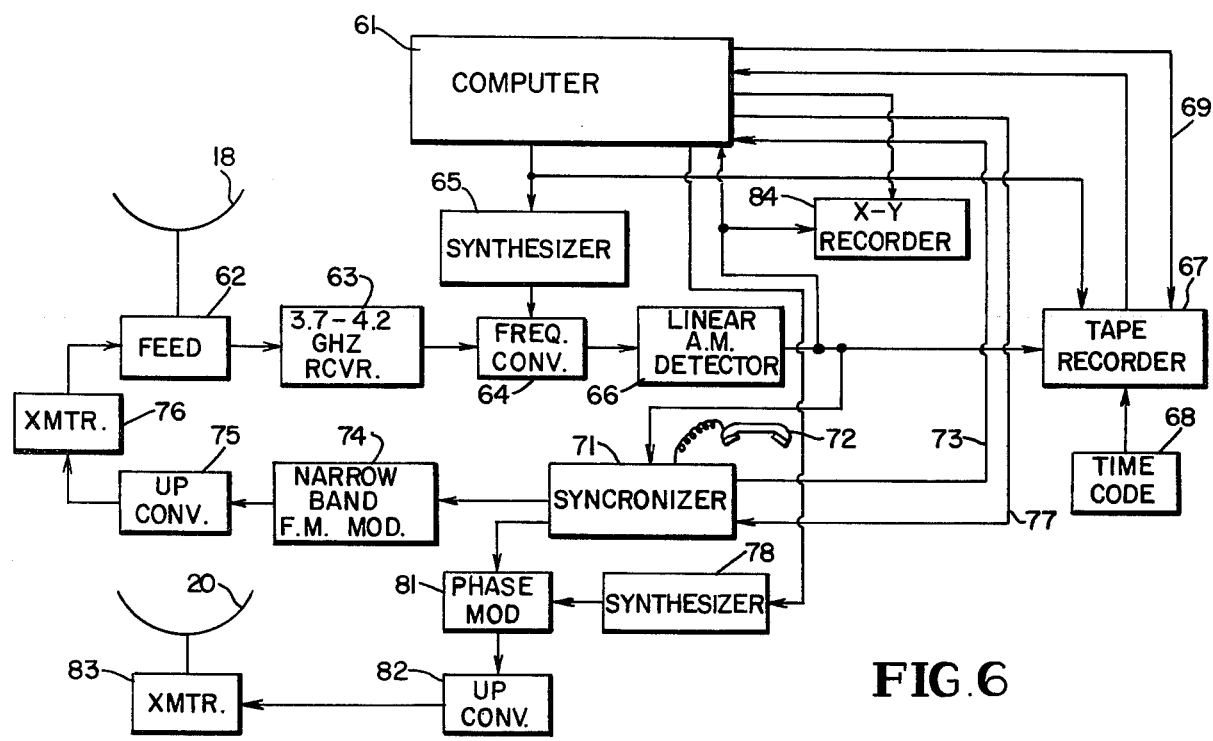
FIG. 6 is a block diagram of apparatus included at a base station in accordance with the present invention.

The various functions performed at station 19 are controlled by a properly programmed general purpose digital computer 61, FIG. 6, which is also responsive to received data. Since computer 61 forms no part of the present invention, but is utilized exclusively for performing routine control, storage and display functions which have been and will be described, no details of the computer are provided. The operations performed by computer 61 could be performed at slower speeds, manually, and the data collected by the computer could also be collected manually, at slower speeds. Since the important operations performed by computer 61 can be performed manually and the control functions performed by the computer are described in detail, no detailed description of the computer or its program is believed to be in order.

The 3.7-4.2 gHz signal radiated from the earth coverage horn of antenna 12 is transduced by high gain antenna 18 and coupled by feed 62 to receiver 63, that is capable of responding to the entire 3.7-4.2 gHz spread of the received signal. Receiver 63 derives an IF output that is supplied to frequency converter 64, which is also responsive to the output of synthesizer 65.

Synthesizer 65 is driven by computer 61 to supply different local oscillator frequencies to converter 64, which responds to its inputs from synthesizer and receiver 63 to scan the 3.7-4.2 gHz output of receiver 63 in 10 kHz or 100 kHz steps, each which has a band pass of 10 kHz. Because of the frequency conversion performed by the transponder in spacecraft 12, the outputs of frequency converter 64 effectively scan the 5.925 gHz-6.425 gHz spectrum to which the high gain antenna included in spacecraft 12 is responsive. Converter 64 is activated by synthesizer 65 to derive the calibration and data traces described supra in connection with FIG. 3, in the manner described in connection with FIGS. 2a and 2b.

Frequency converter 64 includes a mixer responsive to the outputs of receiver 63 and synthesizer 65. The mixer drives a band pass filter, having a 10 kHz pass band centered on 455 kHz. The inputs to converter 64 from synthesizer 65 are controlled by computer 61 to effectively detect the energy in each of the 10 kHz windows across the 0.5 gHz input to receiver 63. Hence, synthesizer 65, frequency converter 64 and receiver 63 function in a manner well-known to those skilled in the spectrum analyzer art to derive many different sampling amplitudes for the different frequencies that are programmed into the local oscillator of synthesizer 65.

The output of converter 64 is applied to a linear AM detector 66, capable of translating the input thereof into a DC output signal that is linearly related to the output of converter 64 over a 40 db amplitude range. Basically, detector 66 includes a constant current source responsive to the output of converter 64. The constant current source drives a full wave rectifier which derives the DC output. Since the rectifier is driven by a constant current source, variations in the impedance of the rectifier, due to the resistance of the diodes thereof changing in response to the wide amplitude swings of the output of converter 64, loading of the constant current source does not change and a linear response is derived.

The output of detector 66 is applied to computer 61 where it is sampled 39 times during each 10 kHz frequency interval and these samples are converted into digital signals that are stored in the computer memory. Each of the samples of the output of detector 66 is correlated to a particular frequency to which detector 66 is effectively responsive, as controlled by the local oscillator frequency applied by synthesizer 65 to converter 64. In other words, the control signals applied to synthesizer 65, for the local oscillator frequency of converter 64, are correlated with the output of detector 66, as indicated by FIGS. 2a and 2b.

If computer 61 is incapable of real time processing of the output of detector 66, the detector output is applied to analog tape recorder 67. Additional tracks of recorder 67 are respectively responsive to time code signals from source 68, as well as frequency indicating signals supplied as control signals by the computer 61 to synthesizer 65. The signals stored in the several channels of tape recorder 67 are fed into the memory of the computer in response to control signals derived by the computer and supplied to the tape recorder via lead 69.

A further output of detector 66 is applied to an input of synchronizer 71 which detects the occurrence of: (a) a 2.2 kHz ringing tone transmitted from portable calibration unit 15 through spacecraft 12 to antenna 18, (b) voice communications that originate at unit 15 and are transmitted to antenna 18 through spacecraft 12, and (c) a 20 millisecond, 5 kHz synchronizing burst tone transmitted from unit 15 and relayed to antenna 18 by spacecraft 12. The 2.2 kHz ringing tone and the voice signals are applied by synchronizer 71 to telephone receiver 72 to establish a voice communication link between station 19 and unit 15 via spacecraft 12. In response to detection of the 20 millisecond, 5 kHz tone, synchronizer 71 derives a signal that is fed by lead 73 to computer 61. Computer 61 responds to the signal on lead 73 to determine the delay time in propagation of electromagnetic signals from station 19 to unit 15. After the propagation time has been determined, computer 61 is able to properly regulate the timing of control signals fed to synthesizer 65 so that the output of the local oscillator of the synthesizer is synchronized with the arrival time of calibrating signals from unit 15. Thereby, when a particular calibrating frequency transmitted from unit 15 is coupled by receiver 63 to input of converter 64, the local oscillator frequency supplied to the converter by synthesizer 65 is properly adjusted.

Synchronizer 71 also controls certain functions and establishes voice communications between station 19 and unit 15, as well as operations of the calibration terminal at station 19. In particular, synchronizer 71 responds to manual and computer derived input signals to derive the following outputs: (a) a 2.2 kHz tone which is used for ringing a telephone receiver at portable calibration unit 15, (b) a 2.5 kHz tone for initiating operation of unit 15, (c) voice signals from telephone 72, and (d) a 5 kHz burst tone for initiating and synchronizing the calibrating terminal included at station 19. The 2.2 kHz and 2.5 kHz tones are derived in response to manual activations, namely in response to lifting the handset of telephone 72 and in response to manual activation of push buttons. The 2.2 kHz and 2.5 kHz tones, as well as the voice signal from telephone 72, are supplied by synchronizer 71 to narrow band FM modulator 74, which in turn drives a frequency converter 75 that develops a relatively narrow band output at approximately 6 gHz. The output of converter 75 is applied to 6 gHz transmitter 76, which in turn drives feed 62 and thence antenna 18. The 6 gHz signal radiated from antenna 18 is transmitted to spacecraft 12, where it is frequency translated to approximately 4 gHz and relayed to receiving antenna 17 of unit 15.

The 5 kHz burst tone is derived in response to a command signal supplied by computer 61 to synchronizer 71 via lead 77. The 5 kHz burst tone synchronizes the frequency shifting of synthesizer 71 at station 18 when antenna 20 is used to transmit calibration signals since the propagation delay time from antenna 20 to antenna 18 is precisely known, in contrast to the variable delay time between mobile unit 15 and station 19.

The calibration terminal at station 19 includes synthesizer 78, phase modulator 81, up frequency converter 82 and transmitter 83 that drives antenna 20. The activation of synthesizer 78 is synchronized with the occurrence of the 5 kHz tone burst since both the synchronizer and the synthesizer are controlled by computer 61. Synthesizer 78 is driven by computer 61 so that the signal from transmitter 83 is stepped in 100 kHz increments, each having a 10 kHz band width to provide a calibration sequence identical to the calibration sequence derived from unit 15. The outputs of synthesizer 78 and the 5 kHz burst tone derived from synchronizer 71 are combined to control the output of phase modulator 81. Phase modulator 81 drives up converter 82, which sequentially derives the 10 kHz band width calibration output signals over the 5.925–6.425 gHz range. The output of converter 82 is supplied to transmitter 83, which is capable of handling the entire spectrum from 5.925 to 6.425 gHz in a substantially uniform manner. The output of transmitter 83 is supplied to antenna 20 to which the narrow beam antenna of spacecraft 12 is pointed. The spectrum transmitted from antenna 20 to spacecraft 12 is frequency translated by the spacecraft and is returned to antenna 18 in the frequency range from 3.7 to 4.2 gHz.

To enable each output of transmitter 83 to cover a band width of 10 kHz, at 100 kHz increments, phase modulator 81 includes a local oscillator having its frequency swept by the output of synthesizer 78 so that a broad band, 10 kHz signal rather than a single frequency tone, is derived from transmitter 83 at each 100 kHz increment over the spectrum from 5.925 to 6.425 gHz.

Figure 4:
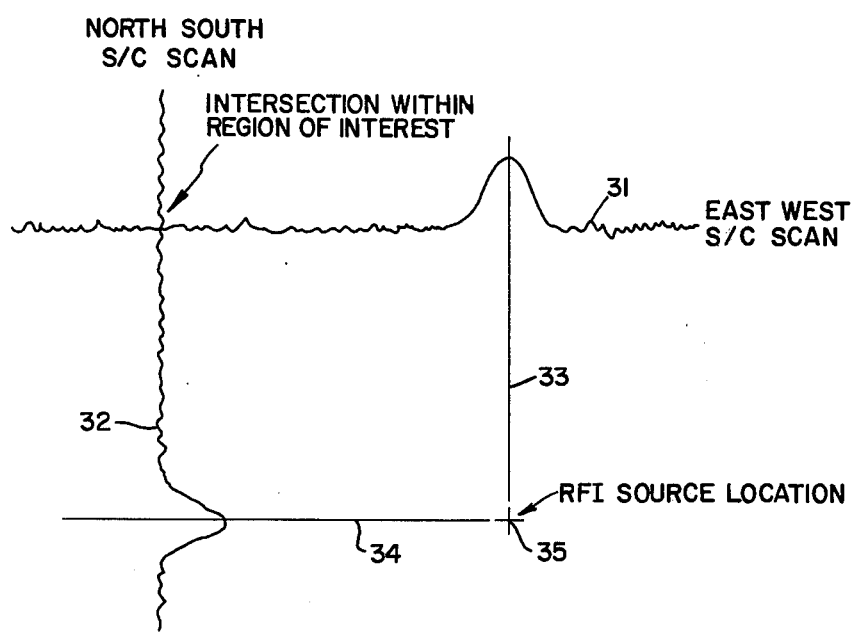
FIGS. 4 and 5 are plots used to describe the method of locating the spatial location of a source of electromagnetic energy in the system of FIG. 1.

To enable the location of a terrestrial source of radio frequency interference with a 6 gHz satellite link to be determined, as described in connection with FIG. 4, the output of detector 66 is applied to X-Y recorder 84 while computer 61 supplies a control signal to synthesizer 65 to maintain the frequency of the local oscillator input to converter 64 constant while control signals for scanning of the narrow beam antenna of spacecraft 12 are being supplied by the computer to a transmitter (not shown) that drives feed 62 and antenna 18. Simultaneously with the scanning of the spacecraft narrow beam antenna above the roll axis of the spacecraft, computer 61 supplies a control signal to recorder 84 so that the X position of the recorder needle is correlated with the roll axis pointing angle of the spacecraft antenna, while the output of detector 66 is being applied to the Y axis of the recorder. In response to a null in the output of detector 66 occurring and being sensed by computer 61, the computer causes the spacecraft antenna to be scanned along the spacecraft pitch axis. As the antenna is scanned along the spacecraft pitch axis, computer 61 supplies a control signal to recorder 84 so that the Y position of the needle is correlated with the pitch axis pointing angle of the antenna while the output of detector 66 is being applied to the X axis of the recorder. Thereby, the traces indicated in FIG. 4 are made and the position of the source is determined. To form traces as illustrated in FIG. 5, the outputs of detector 66 are determined by and stored by computer 61 and are correlated with the antenna position control signals stored in and derived from the computer. The maximum and minimum values during each scan are identified in the computer memory. After the orthogonal scans have been completed, the computer memory drives an X-Y recorder to produce the traces illustrated in FIG. 5.

Figure 7:
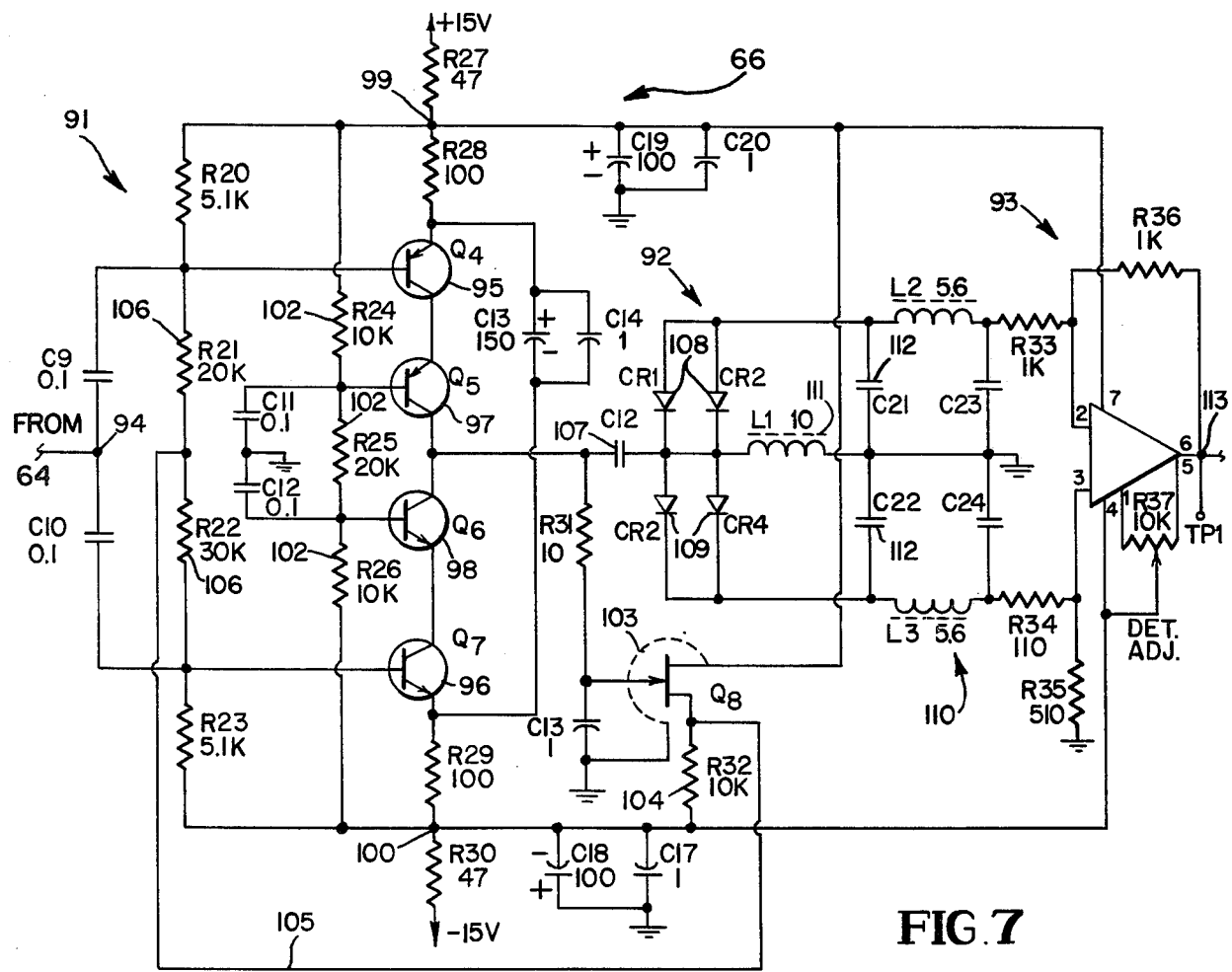
FIG. 7 is a circuit diagram of a linear AM detector capable of operating over a 40 db amplitude range which is preferably employed in the system of FIG. 6.

Reference is now made to FIG. 7 of the drawing wherein there is illustrated a circuit diagram of a preferred embodiment for linear AM detector 66. As indicated supra, detector 66 is particularly adapted to provide a linear, DC output over a 40 db amplitude range. The detector includes a constant current source 91 that drives a full wave rectifier 92, which in turn drives complementary input terminals of differential, DC operational amplifier 93.

Constant current source 91 is responsive to the IF 455 kHz output of frequency converter 64, as coupled to terminal 94. The signal at terminal 94 is applied in parallel through coupling capacitors C9, C10 to the bases of PNP and NPN transistors 95 and 96. The emitter collector paths of transistors 95 and 96 are connected in series with the emitter collector paths of PNP transistor 97 and NPN transistor 98; transistors 95–98 are connected between positive and negative DC power supply terminals 99 and 100. The bases of transistors 97 and 98 are connected by a resistive voltage divider including resistors 102 to DC power supply terminals 99 and 100.

An AC output signal derived from the common terminal for the collectors of transistors 97 and 98 is applied to the gate electrode of field effect transistor 103, having source and drain electrodes connected across DC power supply terminals 99 and 100. The drain electrode of field effect transistor 103 is connected to a DC load resistor 104, across which a DC voltage is developed that is fed back to the bases of transistors 95 and 96 via lead 105 and base bias resistors 106. The feedback voltage developed across resistor 104 maintains the DC level at the collectors of transistors 97 and 98 at 0 volts. The circuit configuration of constant current source 91 provided by the complementary amplifier circuit including transistors 95–98 and the feedback path including lead 105, has a high output impedance of approximately 2 megohms.

The AC output of constant current source 91 is applied via coupling capacitor 107 to full wave rectifier 92 that includes a pair of oppositely poled diodes 108 and 109, the cathodes and anodes of which are respectively driven directly by the signal coupled through capacitor 107. Diodes 108 and 109 become non-linear at large signal levels, greater than 1 volt rms, where the forward resistance thereof may be several hundred ohms. The resistance of diodes 108 and 109 increases rapidly as the level of the AC input thereto is reduced. The resistance change is minimized in the present circuit, to enable the 40 db range to be achieved, by driving the diodes by the constant current source 91.

The signals developed at the anodes and cathodes of diodes 108 and 109 are applied to a low pass filter circuit 110 that removes any ripple effect on the voltages developed at the output electrodes of diodes 108 and 109. Filter 110 is connected in a differential manner to diodes 108 and 109 so that inductor 111 has a common connection with the cathodes of diodes 108 and the anodes of diodes 109, while capacitors 112 shunt the anodes and cathodes of diodes 108 and 109, respectively. The differential voltage developed at the output of low pass filter 110 is applied to the inverting and non-inverting input terminals of operational amplifier 93 which derives an output voltage at terminal 113 that can be coupled to the input of computer 61 and tape recorder 67. The circuit illustrated in FIG. 7 has good linearity down to input levels of a few millivolts; the most linear 40 db segment appears to result with inputs over the 40 db range from 3 millivolts to 300 millivolts.

Figure 8:
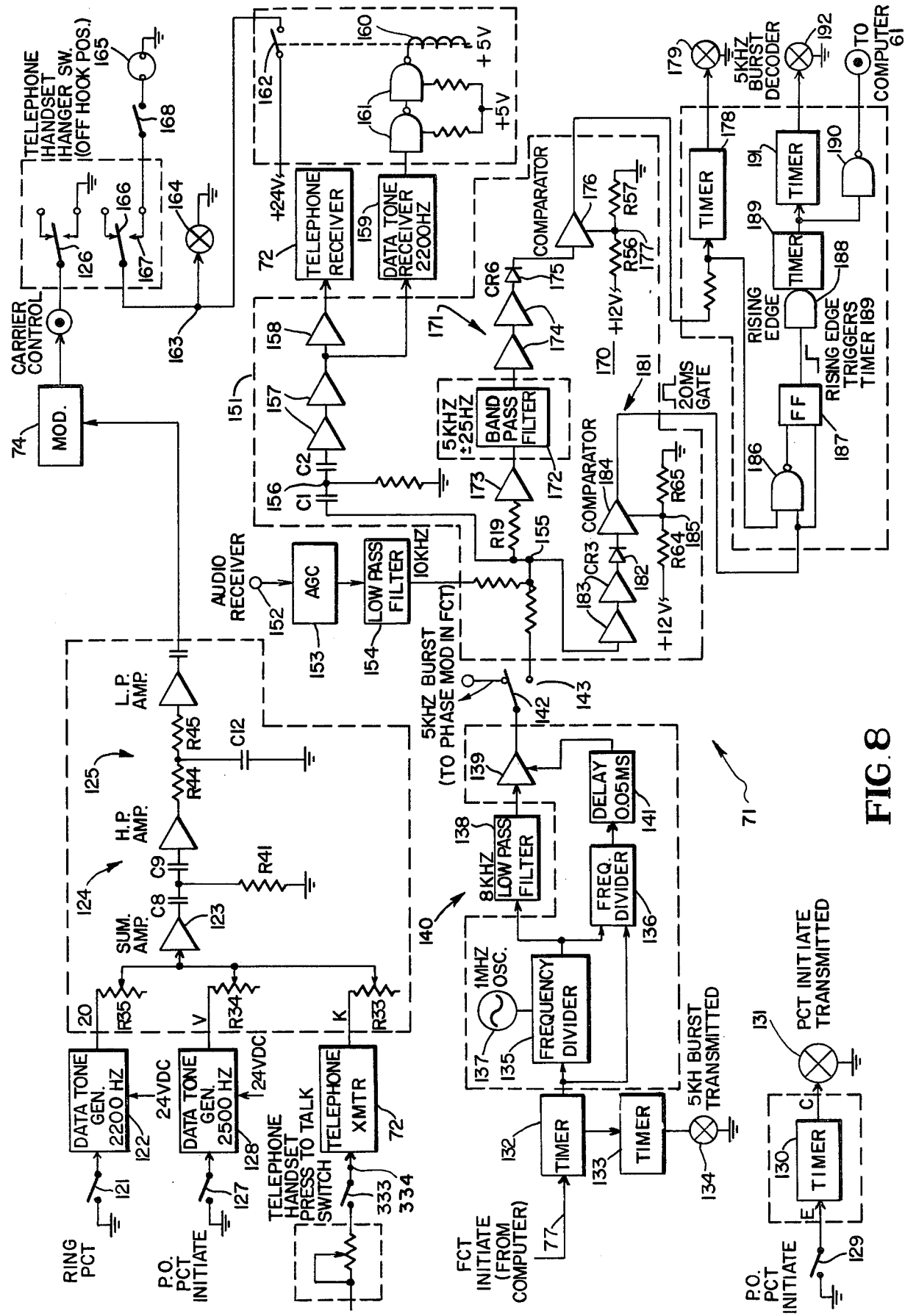
FIG. 8 is a block diagram of a synchronizer apparatus employed in the system of FIG. 6.

Reference is now made to FIG. 8 of the drawing wherein there is illustrated a combined circuit and block diagram of synchronizer 71. Synchronizer 71 enables a single IF frequency to be derived from mixer or converter 64 at all times, enabling a relatively small amount of hardware to be employed so that costs are reduced. Further, synchronizer 71 enables synthesizer 65 to operate in a half duplex mode so that there is an initial transmission to spacecraft 12 and unit 15 until a return signal is received from unit 15 and the satellite, approximately ¼ second after the initial transmission. In response to reception of the return signal, synthesizer 65 is automatically swtiched by computer 61 to receive signals. Since synthesizer 65 operates in the half duplex mode, all possible self-interference is avoided since the same synthesizer frequencies are employed for transmission and reception.

Synchronizer 71 synchronizes computer 61 to be responsive to calibration signals transmitted to antenna 18 from the remote calibration unit 15. Synchronizing computer 61 is accomplished by transmitting a precise pulse transmission from calibrating unit 15 via spacecraft 12 to antenna 18, the calibrating unit derives the precise pulse transmission in response to a receipt of a start tone transmitted from antenna 18 via spacecraft 12. Reception of the precise pulse transmission automatically synchronizes the operation of computer 61 so that synthesizer 65 is stepped in synchronism with receipt of the different frequencies from the calibrating units. Synchronizer 71 also terminates functioning of voice links between station 19 and unit 15.

Consideration is initially given to the manner in which synchronizer 71 generates the four signals which were discussed supra in connection with FIG. 6.

The 2.2 kHz tone used for ringing a telephone receiver at unit 15 is derived in response to an operator closing "ring PCT" switch 121 to apply a ground potential to 2.2 kHz tone generator 122. The 2.2 kHz tone derived from generator 122 is supplied to summing amplifier 123 which drives high pass amplifier 124 and low pass amplifier 125. The signal derived from amplifier 125 is applied to narrow band FM modulator 74.

Modulator 74 is responsive to the output signal of low pass amplifier 125 only while the operator has the hand set of telephone 72 out of its cradle so that the 2.2 kHz tone which actuates the telephone ringing circuit at unit 15 is only transmitted to unit 15 when a telephone call is being placed. To this end, the output of modulator 74 is normally grounded by switch contact 126 (FIG. 8) while the hand set of telephone 72 is on the cradle; switch 126 is released from the ground connection to the position illustrated in FIG. 8, in response to the hand set being removed from the cradle to enable the modulator output to be applied to up converter 75.

When an operator at station 19 desires to initiate a calibrate sequence from unit 15, he closes spring biased switch 127 to apply ground potential to the input of 2.5 kHz tone generator 128. In response to switch 127 being closed, tone generator derives a 2.5 kHz output that is applied to modulator 74 through amplifiers 123, 124 and 125. The 2.5 kHz tone is transmitted from antenna 18 through spacecraft 12 to unit 15; the portable unit detects the tone and transmits back a 20 millisecond 5 kHz tone burst that is detected by synchronizer 71 (as described infra) and fed to computer 61 that generates a command signal to control synthesizer 71.

Ganged with switch 127 is switch 128 which, when closed, applies a ground connection to the input of 330 second timer 130. The output of timer 130 is applied to indicator lamp 131 which is thereby lit for 330 seconds after the operator has commanded the initiation of a calibration sequence. Thereby, personnel at station 19 are advised of the calibration sequence at the remote unit 15 being executed for 5.5 minutes after the command signal for the calibration operation having occurred.

To establish voice communications between station 19 and remote unit 15 via spacecraft 12, the operator activates switch 333 which applies a positive enabling voltage at terminal 334 to the input of telephone transmitter 72. The voice output signal of telephone transmitter 72 is applied to modulator 74 through amplifiers 123, 124 and 125. Switch 333 is depressed only while the hand set of telephone 72 is off of its cradle, whereby the voice signal derived from transmitter 72 is coupled to antenna 18 by modulator 74. Typically, modulator 74 is a voltage controlled oscillator having its center frequency varied in response to the 2.2 kHz, 2.5 kHz or voice outputs of synchronizer 71.

The 5 kHz tone that initiates and synchronizes the operation of the local calibrating unit (including synthesizer 78, phase modulator 81, converter 82, transmitter 83 and antenna 20) is derived in synchronizer 71 in response to the output pulse of computer 61 on lead 77. Computer 61 derives the output pulse on lead 77 in response to the operator activating a switch (not shown) that supplies a control voltage to the computer to indicate that calibrating signals are to be derived from the local calibration unit. In response to the leading edge of the pulse on lead 77, one microsecond timer 132 is activated. The output pulse of timer 132 is applied to one second timer 133 which drives lamp indicator 134 to indicate to the operator that a command sequence for the local calibration unit has been initiated.

A second output of timer 132 is applied to network 140 that derives 5 kHz, 20 millisecond tone bursts that are supplied to phase modulator 81. The tone bursts subsist for a duration of 20 milliseconds, so that 40 complete cycles of the tone bursts are derived. Each burst begins and ends at a zero crossing of the sinusoidal 5 kHz tone.

To derive the tone burst with the stated requirements, the output of timer 132 is applied in parallel to reset inputs of divide by 200 frequency divider 135 and divide by 40 frequency divider 136. Divider 135 is also driven by the output of 1 mHz oscillator 137 whereby the divider derives a 5 kHz square wave. The output of divider 135 is applied to low pass filter 138, having a cut-off frequency of 8 kHz, whereby the filter derives a sinusoidal output having a frequency of 5 kHz. The output of filter 138 is applied to gated amplifier 139, which is normally maintained in a cut-off, disabled state.

Amplifier 139 is enabled for 20 milliseconds by feeding the output of divider 136 to it, after a 0.05 millisecond delay is interposed by circuit 141. Counter 136 responds to the inputs thereof to derive a 20 millisecond long pulse which is supplied to the enable input of amplifier 139. Delay circuit 141 is provided to compensate for the inherent delay provided by filter 138 on the 5 kHz signal applied to it by divider 135. Thereby, the output of amplifier 139 is a 5 kHz burst tone having a 20 millisecond duration and wherein the burst begins and ends at the zero crossing points of the sinusoidal output of the amplifier. The output of amplifier 139 is applied as a control voltage of phase modulator 81 and thence is transmitted back to antenna 18 via spacecraft 12.

If it is desired to test the derivation of the 5 kHz, 20 millisecond burst, switch 142 is activated from the illustrated position so that it engages contact 143 and is supplied to the receiver portion of synchronizer 71, i.e., so that the burst derived from circuit 134 is processed in the same manner as a burst from the remote calibrating unit 15.

Synchronizer 71 includes receiver unit 151 which is responsive to the output of AM detector 66, as coupled to terminal 152, or to the signal coupled to terminal 143. The signal supplied to unit 151 by terminal 152 enables the detection and monitoring of: (a) a 2.2 kHz ringing tone derived from remote calibrating unit 15, (b) voice signals derived from the remote calibrating unit, and (c) a 5 kHz tone burst that enables computer 61 to be synchronized and which is derived from unit 15.

The signal at terminal 152 is applied to AGC circuit 153, which drives low pass filter 154, having a cut-off frequency of 10 kHz so that the 2.2 kHz, 2.5 kHz and 5 kHz tones, as well as the voice signals at terminal 152, are coupled by the filter to terminal 155. The voice frequency, 2.2 kHz and 2.5 kHz signals are fed from terminal 155 to high pass filter 156 which drives amplifiers 157, the output of which drives telephone receiver 72 through amplifier 158. The output of amplifers 157 is also supplied to 2.2 kHz tone receiver 159 which derives a substantial output signal only in response to its input being 2.2 kHz ± 11 Hz. The output of tone receiver 159 drives relay 160 through drive circuits 161. Relay 160 is energized when tone receiver 159 is responsive for a substantial duration (e.g., 0.25 seconds) to a 2.2 kHz tone; energization of relay 160 closes contacts 162 to apply an energizing voltage to terminal 163. In response to the energizing voltage being applied to terminal 163, indicator lamp 164 is activated to provide the operator at station 19 with an indication that telephone 72 is being rung in response to a signal originating at unit 15 and coupled through spacecraft 12. The energizing voltage at terminal 163 is also applied to buzzer 165 in response to the hand set of telephone 72 being on its cradle (causing contacts 166 and 167 to be engaged) and when the operator has activated switch 168 so that it is closed. Thereby, both audio and visual signals are provided to the operator at station 19 in response to the telephone at the station bieng rung by the 2.2 kHz tone derived from the remote calibration unit 15.

The synchronization signal derived from remote calibration unit 15 has the same characteristics as the synchronization signal derived from the local calibration unit, i.e., it is a 5 kHz burst tone that subsists for 20 milliseconds. The presence of the 5 kHz, 20 millisecond burst tone synchronizer 71 at station 19 is detected by circuit 170 that responds only to a 5 kHz tone and to only a 20 millisecond pulse.

Circuit 170 includes a first parallel channel 171 comprising band pass filter 172, having a center frequency of 5 kHz and a band pass of ± 25 Hz. Filter 172 is driven by the signal at terminal 155 through amplifier 173; the band pass filter derives an output signal that is fed by amplifiers 174 to diode detector 175. Detector 175 derives a DC output signal which is supplied to comparator 176, havind a second reference input at terminal 177. In response to the input to comparator 176 from detector 175 exceeding the voltage at terminal 177, the comparator derives a binary one level; for all other inputs to the comparator, a 0 output is derived thereby. The binary output of comparator 176 is applied to 10 second timer 178, which in turn activates lamp indicator 179 to indicate the presence of a 5 kHz signal.

Circuit 170 also includes a second channel 181, that comprises diode detector 182, which is driven by amplifiers 183 by the signal at terminal 155. Detector 182 derives a DC output signal that is supplied to one input of comparator 184, having a second DC, reference input, at terminal 185. In response to the DC level derived from detector 182 exceeding the DC level at terminal 185, comparator 184 derives a binary one output. Comparator 184 includes a low pass filter so that in response to the occurrence of a 5 kHz, 20 millisecond burst tone, the comparator derives a 20 millisecond binary one level.

The outputs of comparators 176 and 184 are combined in a network including NAND gate 186 and flip-flop 187. Gate 186 includes two inputs which are driven by the outputs of comparators 176 and 184. The output of gate 186 is applied to the reset input of flip-flop 187, having a set input which is driven by the output of comparator 184. In response to either input to NAND gate 186 being a binary zero, the output of the gate is a binary one whereby flip-flop 187 is activated to the reset state. In response to both inputs of NAND gate 186 being binary ones, as occurs in response to a 20 millisecond, 5 kHz burst tone being received, gate 186 derives a binary zero output. Since flip-flop 187 sets and resets in response to zero inputs, a binary one level is derived from the output of the flip-flop in response to a 20 millisecond, 5 kHz tone burst being received. The positive binary one signal at the output of flip-flop 187 is detected by network 188, which triggers one millisecond timer 189. The one millisecond timer 189 is applied as a synchronizing input to computer 61 via lead 73 and driver network 190. The one millisecond output of timer 189 is also applied to 100 second timer 191 which drives lamp indicator 192 to provide an indication to the operater that synchronization between the computer and the remote calibration unit has been effected.

If it is desired to determine if the 5 kHz burst tone of the local calibration unit has the desired characteristics, switch 142 is closed and the signal applied to contact 143 is coupled to terminal 155 and thence to channels 171 and 181. If the burst tone has the desired characteristics, indicator lamp 192 is activated.

Figure 9:
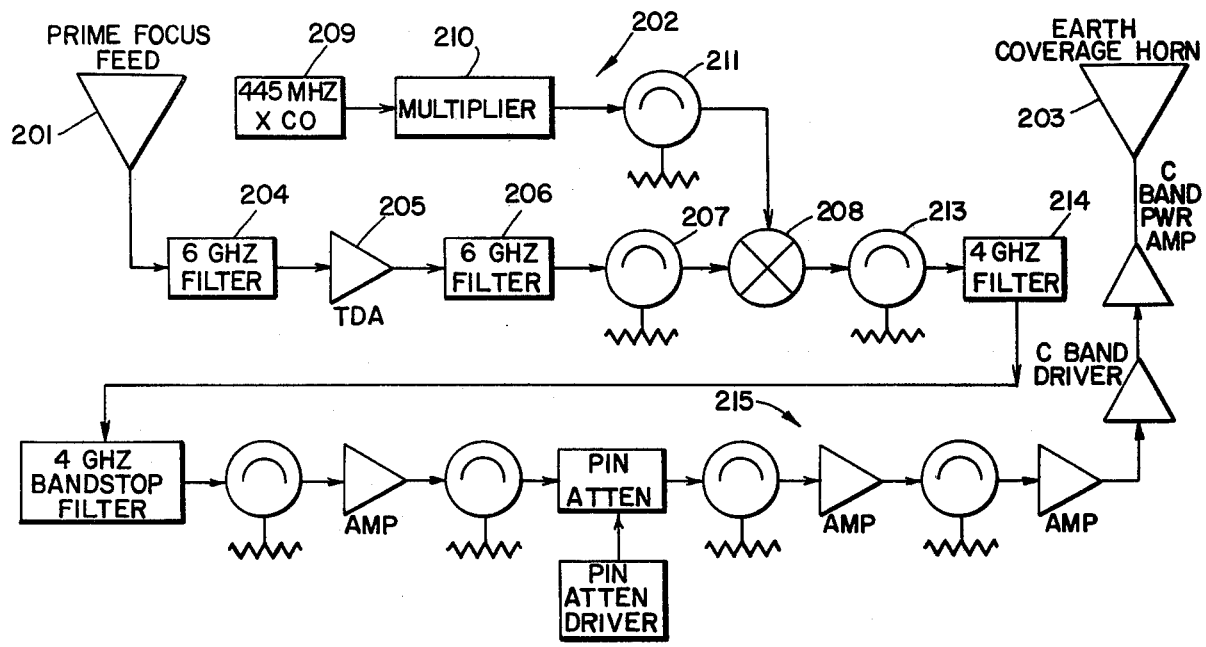
FIG. 9 is a block diagram of a transponder employed in the spacecraft illustrated in FIG. 1.

Reference is now made to FIG. 9 of the drawing wherein there is illustrated a block diagram of a preferred embodiment of the transponder apparatus on spacecraft 12. Basically, the transponder includes: a narrow beam high gain feed 201 responsive to the 5.925 – 6.425 gHz energy; network 202 for shifting the frequency of the 5.925 – 6.425 gHz energy; and an earth coverage horn 203 for transmittting the shifted energy as an electromagnetic wave in the frequency range from 3.7 – 4.2 gHz.

Network 202 includes a band pass filter 204 responsive to the energy transduced by feed 201; filter 204 has a center frequency of 6.175 gHz and pass band of ± 0.250 gHz. The output signal of filter 204 is fed to amplifier 205, which drives filter 206, having the same characteristics as filter 204. The output of filter 206 is supplied to circulator 207 which drives one input of mixer 208. A second input to mixer 208 is responsive to a constant frequency local oscillator signal derived by feeding the output of 445 mHz crystal oscillator 209 to times 5 frequency multiplier 210, which in turn drives the mixer through circulator 211. Mixer 208 responds to its input signals to derive a beat frequency signal having a center frequency of 3.95 gHz, with ± 0.25 gHz side bands.

The output signal of mixer 208 is applied to circulator 213, the output of which drives filter 214, having a 0.5 gHz band pass centered about 3.95 gHz. The output of filter 214 drives a filter, amplifying and attenuating network 215, having an output signal with an amplitude directly proportional to the amplitude of the energy transduced by feed 201. The output signal of network 215 is applied to earth coverage horn 203, whereby the amplitude of the output signal of horn 203 is directly proportional to the amplitude of the energy transduced by feed 201 over the 0.5 gHz band width of the transduced energy and for a 40 db amplitude range.

Figure 10:
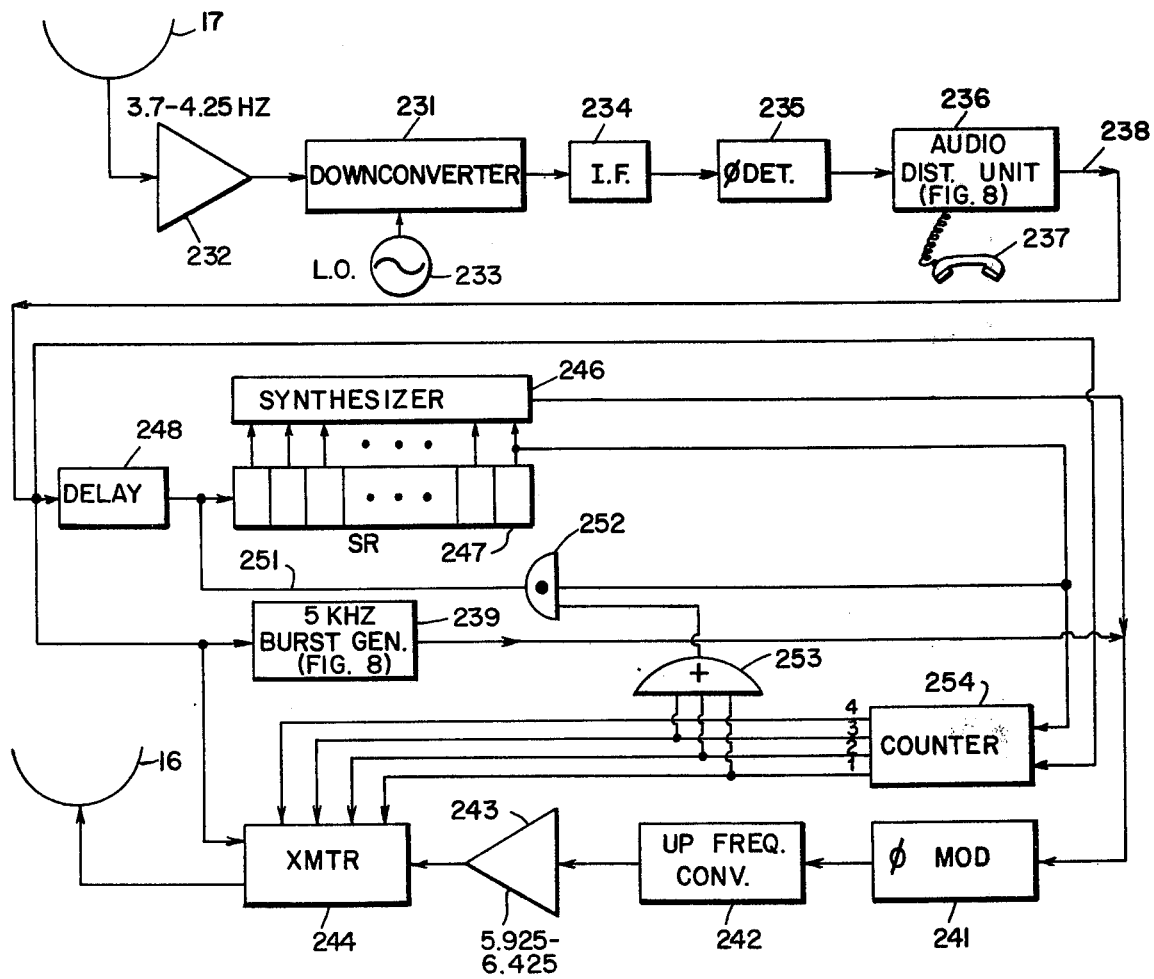
FIG. 10 is a block diagram of a preferred embodiment of a mobile calibrating unit employed with the system of FIG. 1.

Reference is now made to FIG. 10 of the drawing wherein there is illustrated a block diagram of the apparatus included at mobile calibration unit 15. Unit 15 includes an antenna 17 responsive to the 3.7 – 4.2 gHz signal transmitted from the earth coverage horn of spacecraft 12. The 3.7 – 4.2 gHz signal is supplied to down frequency converter 231 via preamplifier 232, having a pass band from 3.7 – 4.2 gHz. Converter 231 is also responsive to the output of local oscillator 233, whereby the down converter derives a beat frequency that is fed by IF amplifier 234 to phase detector 235. Phase detector 235 drives audio distribution unit 236 which is similar to a portion of the apparatus included in network 151.

Phase detector 235 drives audio distribution unit 236 with a voice frequency signal, a 2.2 kHz tone to apprise an operator that the telephone 237 at unit 15 is being rung, and a 2.5 kHz tone to signal that calibration signals are to be transmitted from unit 15 to station 19 via spacecraft 12. The voice frequency and ringing signals are applied by distribution unit 236 to telephone 237, in the manner indicated supra in connection with circuits 153, 154, 156, 157, 158, 159, 161 and relay 160 of FIG. 8. Audio distribution unit 236 responds to the 2.5 kHz tone by providing 2.5 kHz tone detecting circuitry the same as tone receiver 159 (except for a shift in detection frequency) driver 161 and relay 160 of FIG. 8. Thereby, unit 236 derives a binary one output signal on lead 238 while the 2.5 kHz tone is being received.

The binary one signal on lead 238 is coupled to 5 kHz burst tone generator 239 which is identical with the burst tone generator 134 included in FIG. 8. In response to the binary one level on lead 238, generator 239 derives a 5 kHz, 20 millisecond burst tone that is supplied to phase modulator 241. In response to the output of generator 239, modulator 241 derives a carrier frequency that is modulated for 20 milliseconds by the tone output of generator 239. The output of phase modulator 241 can be detected at station 19 with amplitude modulation detector 66 because the modulation is by a single frequency tone. The output of modulator 241 is supplied to up frequency converter 242 which derives an output at the low end of the 5.925 – 6.425 spectrum in response to the 5 kHz tone burst. The output of converter 242 is applied to amplifier 243, which drives transmitter 244. In response to the binary one output on lead 238, which occurs while the 5 kHz tone burst is derived, the power control network of transmitter 244 (preferably of the type described in copending commonly assigned application Ser. No. 782,480 filed Mar. 29, 1977) is adjusted to transmit a maximum power level, which is coupled to transmitting antenna 16. The 5 kHz tone burst modulated on the approximately 6 gHz carrier of transmitter 244 is transmitted back to station 19 via spacecraft 12. At station 19, detection of the tone burst results in activation of computer 61 to initiate stepping of the receiver so it is in synchronism with the calibrating signals derived from unit 15.

The calibrating signals are derived from unit 15 by sequentially activating synthesizer 246 so that calibrating signals having a frequency displacement of 100 kHz are sequentially derived from transmitter 244 for each of four power levels, 0 dbw, 10 dbw, 20 dbw and 30 dbw. Activation of synthesizer 246 is not initiated until computer 61 has had adequate time to receive the 5 kHz tone burst from unit 15 and to initiate activation of the synthesizer at station 19.

To these ends, the binary one signal on lead 238 at the output of distribution unit 236 is supplied to a start input terminal of shift register 247 via delay network 248. The delay time of network 248 is equal to the time required for station 19 to activate synthesizer 71 after the trailing edge of the 5 kHz burst tone transmitted from station 15 has been detected at station 19. Shift register 247 effectively includes 5000 stages, one for each of the 5000 frequencies to be derived from synthesizer 246 for calibration purposes. Shift register 247 also includes a clock source so that the different stages of the shift register are activated periodically in sequence after delay network 248 applies a signal to the start input of the register. The activation time between adjacent stages of shift register 247 is equal to the time spacing between the different output frequencies of synthesizer 65 at station 19 when the station is responsive to the calibration signal from unit 15. In response to each output of shift register 247, a different frequency is derived from synthesizer 246 and is coupled to phase modulator 241. The outputs of synthesizer 246 are converted by phase modulator 241 into signals that are coupled to transmitter 244 as waves having a 10 kHz band width, with 100 kHz intervals between adjacent waves.

To enable four different power levels to be derived from transmitter 244 during each calibration cycle, the stages of shift register 247 are activated in sequence four times in response to each 2.5 kHz tone being detected by unit 236. To this end, a feedback path 251 is provided between the last stage of shift register 247 and the start input of the shift register. The feedback path includes AND gate 252 that is enabled in response to OR gate 253, which is driven by output stages 1, 2 and 3 of counter 254. Counter 254 is activated so that an output signal is derived from stage 1 thereof in response to a binary one signal being derived on lead 238 when the 2.5 kHz tone is detected. Counter 254 is driven to its stages 2, 3 and 4 in response to the 1st, 2nd and 3rd outputs being respectively derived from the last stage of shift register 247. Thereby, shift register 247 is sequenced four times and four complete activation cycles of synthesizer 246 are proivded. Counter 254 is fundamentally a four stage shift register which is driven to its first stage by the output of the audio distribution unit 236. The counter is advanced to stages 2, 3 and 4 in response to output pulses from the most significant bit stage of shift register 247 after counter 254 has been activated to its first stage by the output of unit 236. During the first activation cycle of shift register 247, while counter 254 is enabled so that its stage 1 is enabled, transmitter 244 is activated so that a 0 dbw power level is derived from it. In response to counter 254 being energized so that stages 2, 3 and 4 thereof are enabled, transmitter 244 is activated so that the output thereof is at the power levels +10 dbw, +20 dbw, and +30 dbw, respectively. This is accomplished by feeding the outputs of stages 1–4 of counter 254 to four separate input terminals of transmitter 244, which responds to these signals to derive the four power levels.

While there has been described and illustrated one specific embodiment of the invention, it will be clear that variations in the details of the embodiment specifically illustrated and described may be made without departing from the true spirit and scope of the invention as defined in the appended claims.

What is claimed is:

1. A method of determining radio frequency interference with communication links including a celestial body and an artificial geostationary satellite of the body, said interference originating from the body, said links being in a predetermined spectrum, comprising the steps of: (a) pointing a narrow beam antenna on the satellite toward a predetermined region of the body while only noise sources in the spectrum are radiated from the region toward the satellite; (b) transmitting a calibrating electromagnetic wave of predetermined EIRP having a frequency in the spectrum from the region toward the satellite while the antenna is pointed toward the predetermined region; (c) separately measuring the levels of electromagnetic energy received by the antenna in the spectrum during steps (a) and (b); and (d) comparing the measured, received energy levels to determine the presence of radio frequency interference in the spectrum.

2. The method of claim 1 further including the steps of: (e) pointing the antenna toward an area wherein it is known that there is a minimum amount of interference in the spectrum; (f) measuring the level of electromagnetic energy in the spectrum received by the antenna during step (e); and (g) from the measurement step of (f), determining whether the measurement of electromagnetic energy level during step (f) exceeds the level of electromagnetic energy measured during step (b).

3. The method of claim 2 further including the steps of: (h) measuring the level of electromagnetic energy received by the antenna during step (a) in each of a plurality of frequency bands across the spectrum; (i) transmitting during step (b) waves of predetermined amplitude in each of a plurality of frequency bands across the spectrum; and (j) measuring the level of energy received by the antenna while steps (b) and (c) are being performed in each of the plurality of frequency bands of step (i).

4. The method of claim 3 wherein the step of measuring in step (h) comprises measuring in a given number of bands and the step of transmitting in step (i) comprises transmitting in a lesser number of bands than those in step (h).

5. The method of claim 1 further including the steps of: (e) measuring the level of electromagnetic energy received by the antenna during step (a) in each of a plurality of frequency bands across the spectrum; (f) transmitting during step (b) waves of predetermined amplitude in each of a plurality of frequency bands across the spectrum; and (g) measuring the level of energy received by the antenna while steps (b) and (c) are being performed in each of the plurality of frequency bands of step (f).

6. The method of claim 5 further including the steps of: (h) repeating steps (b), (c), (d) and (f) for each of a plurality of relatively widely spaced EIRPs; and (i) from the comparisons of the received electromagnetic energy for a particular frequency band determining the amplitude and frequency of an interference source.

7. The method of claim 6 further including the steps of pointing the antenna at a plurality of different areas on the body and repeating steps (a) – (i) at each of the areas.

8. The method of claim 5 wherein the measuring step is performed by relaying a replica of the electromagnetic energy received by the antenna during steps (a) and (b) to a station on the body, effectively determining the time required to transmit a radio wave from the region to the station via the satellite; and from the determined time, synchronizing the transmission and reception of the waves during steps (b) and (c) so that the station is tuned to receive waves of predetermined frequencies transmitted during step (b) as those predetermined frequencies are propagated to the station from the region via the satellite.

9. The method of claim 5 wherein a plurality of measurements are made during step (e) at each of the frequency bands, and in response to the measurements at each frequency band computing a statistical property of the electromagnetic energy received at each of the frequency bands.

10. The method of claim 9 wherein the step of computing the statistical property comprises computing the average amplitude of the electromagnetic energy in each of the frequency bands.

11. The method of claim 9 wherein the step of computing the statistical property comprises computing the standard deviation of the electromagnetic energy in each of the frequency bands.

12. A system for determining radio frequency interference with communication links including a celestial body and an artifical geostationary satellite of the body, said interference originating from the body, said links being in a predetermined spectrum, comprising a relay station on the satellite said relay station including a narrow beam antenna pointing at a predetermined region of the body establishing an uplink for said interference, a second antenna on the body for establishing a communication downlink between the satellite and an Earth station on the body, and means located at the satellite for frequency translating signals and transmitting said signals between the narrow beam antenna and the second antenna; means located at the predetermined region for transmitting calibration signals with a predetermined region for transmitting calibration signals with a predetermined EIRP in the spectrum via another uplink toward the satellite, whereby the satellite relays the calibration signals back to the Earth station via said down link, said Earth station including means including the second antenna for receiving electromagnetic energy shifted in frequency by the relay station and coupled from the region to the Earth station via the satellite, circuit means at the Earth station for operating said receiving means while only RFI noise sources in the spectrum radiate from the region toward the narrow beam antenna via the interference uplink and only the calibration signals are in said another uplink and for operating the receiving means to be responsive to the calibration signals in the spectrum transmitted from the region through the narrow beam antenna and relayed through the satellite to the Earth station, said circuit means being responsive to the electromagnetic energies received by the Earth station for comparing the levels of the received energies while RFI noise sources and the calibration signals are transmitted from the region to the Earth station via the narrow beam antenna and the satellite to enable the presence of a source of radio frequency interference in the spectrum to be determined at the region.

13. The system of claim 1, wherein the circuit means comprises means for measuring the level of electromagnetic energy received at the Earth station in each of a plurality of frequency bands across the spectrum.

14. The system of claim 13 further including means for controlling the means for transmitting calibration signals so that a wave of predetermined EIRP is transmitted from the region toward the narrow beam antenna in each of a plurality of frequency bands across the spectrum, and further including means for synchronizing the receiving means so that the Earth station is tuned to receive waves of predetermined frequencies transmitted from the means for transmitting calibration signals as those predetermined frequencies are propagated to the Earth station via the narrow beam antenna and said another uplink.

15. The system of claim 12 wherein the circuit mean comprises means for controlling the receiving means to be responsive to the plurality of frequency bands while only RFI noise is being transmitted from the region toward the narrow beam antenna.

16. The system of claim 12 wherein the circuit means comprises means for controlling the receiving means so that a plurality of measurements are made at each of the frequency bands while only RFI noise is being transmitted to the narrow beam antenna from the region.

17. The system of claim 12 wherein the circuit means comprises computing means responsive to the received RFI noise for computing statistical properties of the electromagnetic energy received in each of the frequency bands.

* * * * *